US010353675B2

(12) United States Patent
Cebula (10) Patent No.: US 10,353,675 B2
(45) Date of Patent: *Jul. 16, 2019

(54) DISCOVERING HIGH-LEVEL LANGUAGE DATA STRUCTURES FROM ASSEMBLER CODE (71) Applicant: International Business Machines Corporation, Armonk, NY (US)

(72) Inventor: Richard Cebula, Southampton (GB)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/791,721

(22) Filed: Oct. 24, 2017

(65) Prior Publication Data
US 2018/0314502 A1    Nov. 1, 2018

Related U.S. Application Data (63) Continuation of application No. 15/581,292, filed on Apr. 28, 2017.

(51) Int. Cl.
G06F 17/30 (2006.01)
G06F 17/21 (2006.01)
(Continued)

(52) U.S. Cl.
CPC ............... *G06F 8/41* (2013.01); *G06F 8/31* (2013.01); *G06F 8/51* (2013.01); *G06F 8/52* (2013.01);
(Continued)

(58) Field of Classification Search
CPC .. G06F 17/2247; G06F 17/21; G06F 17/5022; G06F 17/30961; G06F 17/30917;
(Continued)

(56) References Cited

U.S. PATENT DOCUMENTS 4,694,420 A * 9/1987 Pettet ..................... G06F 8/53
714/38.1
6,021,272 A * 2/2000 Cahill .................... G06F 8/52
717/147

(Continued)

OTHER PUBLICATIONS

Peng Wang et al., Compiler verification meets cross-language linking via data abstraction, Oct. 20-24, 2014, [Retrieved on Feb. 25, 2019]. Retrieved from the internet: <URL: https://dl.acm.org/citation.cfm?id=2660201> 16 Pages (675-690) (Year: 2014).*

(Continued)

*Primary Examiner* — Anibal Rivera
(74) *Attorney, Agent, or Firm* — Aaron N. Pontikos (57) ABSTRACT

A computer-implemented method for transforming implicit data structures expressed by assembler code into high-level language structures includes analyzing a section of assembler code to identify a plurality of data items. The computer-implemented method further includes storing the plurality of data items in a plurality of groups. The computer-implemented method further includes modifying one or more groups in the plurality of groups based, at least in part, on a pair of adjacent groups having a non-identical overlap. The computer-implemented method further includes creating an overlap list for each group. The computer-implemented method further includes generating data modeling language for the section based, at least in part, on each overlap list. A corresponding computer system and computer program product are also disclosed.

6 Claims, 7 Drawing Sheets (51) Int. Cl.
| | |
|---|---|
| *G06F 9/46* | (2006.01) |
| *G06F 9/44* | (2018.01) |
| *G06F 9/30* | (2018.01) |
| *G06F 8/41* | (2018.01) |
| *G06F 8/51* | (2018.01) |
| *G06F 16/901* | (2019.01) |
| *G06F 8/52* | (2018.01) |
| *G06F 8/53* | (2018.01) |
| *G06F 8/30* | (2018.01) |
| *G06F 8/75* | (2018.01) |
| *G06F 9/34* | (2018.01) |
| *G06F 17/50* | (2006.01) |

(52) U.S. Cl.
CPC .................. *G06F 8/53* (2013.01); *G06F 8/75* (2013.01); *G06F 16/9027* (2019.01); *G06F 9/342* (2013.01); *G06F 17/5022* (2013.01)

(58) Field of Classification Search
CPC .......... G06F 8/53; G06F 8/4441; G06F 8/425; G06F 8/441; G06F 8/447; G06F 8/20; G06F 8/35; G06F 8/443; G06F 8/52; G06F 9/5027; G06F 9/541; G06F 9/3004; G06F 9/4448; G06F 9/342; G06F 11/3624; G06F 12/084; G06F 12/0808
See application file for complete search history.

(56) References Cited

U.S. PATENT DOCUMENTS

| | | | | |
|---|---|---|---|---|
| 6,275,984 | B1* | 8/2001 | Morita | G06F 8/441 717/151 |
| 6,317,873 | B1* | 11/2001 | Townsend | G06F 8/53 717/142 |
| 7,337,438 | B1* | 2/2008 | Dobbins | G06F 8/425 717/141 |
| 8,448,130 | B1* | 5/2013 | Pillarisetti | G06F 8/447 717/104 |
| 8,762,415 | B2 | 6/2014 | Catahan, Jr. et al. | |
| 9,015,680 | B1* | 4/2015 | Shropshire | G06F 11/3624 717/126 |
| 2002/0046294 | A1* | 4/2002 | Brodsky | G06F 9/541 709/246 |
| 2002/0078010 | A1* | 6/2002 | Ehrman | G06F 9/5027 |
| 2004/0002845 | A1* | 1/2004 | Akiba | G06F 17/5022 703/14 |
| 2006/0195556 | A1* | 8/2006 | Shamia | H04L 29/06 709/220 |
| 2007/0271553 | A1* | 11/2007 | Higgins | G06F 8/53 717/136 |
| 2010/0131934 | A1* | 5/2010 | Kim | G06F 8/447 717/137 |
| 2010/0138630 | A1* | 6/2010 | Persson | G06F 9/342 711/214 |
| 2010/0269094 | A1* | 10/2010 | Levenshteyn | G06F 8/20 717/109 |
| 2012/0216012 | A1* | 8/2012 | Vorbach | G06F 8/443 712/11 |
| 2013/0018902 | A1 | 1/2013 | Vickers et al. | |
| 2015/0120998 | A1* | 4/2015 | Wang | G06F 12/084 711/106 |
| 2015/0169453 | A1* | 6/2015 | Shanbhogue | G06F 12/0808 711/105 |
| 2015/0193213 | A1 | 7/2015 | Warunjikar et al. | |
| 2015/0277864 | A1* | 10/2015 | Muramatsu | G06F 8/41 717/140 |
| 2015/0379049 | A1* | 12/2015 | Gao | G06F 16/80 707/804 |
| 2016/0062954 | A1* | 3/2016 | Ruff | G06F 17/21 715/249 |
| 2016/0196112 | A1* | 7/2016 | Edwards | G06F 8/30 717/107 |
| 2017/0083314 | A1* | 3/2017 | Burger | G06F 9/3004 |
| 2017/0124214 | A1* | 5/2017 | Dryfoos | G06F 16/86 |
| 2017/0124219 | A1* | 5/2017 | Dryfoos | G06F 16/86 |

OTHER PUBLICATIONS

IBM, High Level Assembler for z/OS & z/VM & z/VSE, Programmer Guide, Jul. 2008, [Retrieved on Feb. 25, 2019]. Retrieved from the internet: <URL: http://idcp.marist.edu/enterprisesystennseducation/HLASM%20Prog%20Guide%20Sept%2013.pdf> 484 Pages (1-460) (Year: 2008).*

IBM Appendix P, "List of IBM Patents or Patent Applications to be Treated as Related", Dated Oct. 24, 2017, 2 pages.

Wang et al., "Compiler Verification Meets Cross-Language Linking Via Data Abstraction", OOPSLA '14: Proceedings of the 2014 ACM International Conference on Object Oriented Programming Systems Languages & Applications, Oct. 20-24, 2014, Portland, OR, USA, pp. 675-690.

"P154476: New Datamap(DFDL) Option", Closed date May 3, 2016, Evidence of Grace Period Use or Sale, 4 pages, <http://www-01.ibm.com/support/docview.wss?uid=isg1P154476>.

Cebula, R., "Discovering High-Level Language Data Structures From Assembler Code", U.S. Appl. No. 15/581,292, filed Apr. 28, 2017, pp. 1-32.

"High Level Assembler for z/OS & z/VM & z/VSE", IBM, Release 6, Jul. 2008, © Copyright International Business Machines Corporation 1982, 2008, 484 pages.

* cited by examiner

| Offset | 610 | (B) 620 | (C) 630 | (D) 640 | (A) 610 |
|---|---|---|---|---|---|
| 0 611 | MY_DATA_1 601 | MY_DATA_2 602 | MY_DATA_4 604 | MY_DATA_6 606 | |
| 1 612 | MY_DATA_1 601 | MY_DATA_2 602 | MY_DATA_5 605 | MY_DATA_7 607 | |
| 2 613 | MY_DATA_1 601 | MY_DATA_2 602 | PADDING 608 | PADDING 609 | |
| 3 614 | MY_DATA_1 601 | | | | MY_DATA_3 603 |

FIG. 6D

DISCOVERING HIGH-LEVEL LANGUAGE DATA STRUCTURES FROM ASSEMBLER CODE

STATEMENT ON PRIOR DISCLOSURES BY AN INVENTOR

The following disclosure(s) are submitted under 35 U.S.C. 102(b)(1)(A) as prior disclosures by, or on behalf of, a sole inventor of the present application or a joint inventor of the present application:

IBM High Level Assembler (HLASM) fix made publicly available on May 3, 2016; a description of the fix and the release date for the fix ("Closed Date") can be found at: http://www-01.ibm.com/support/docview.wss?uid=isg1PI54476.

BACKGROUND OF THE INVENTION

The present invention relates to processing assembler code, and more specifically to discovering high-level language data structures by generating data model language from assembler code.

Multiple programming languages are often used together within software programs. Accordingly, it is important that data can be shared between multiple programming languages in order for different programs and languages to effectively work together. Most high-level programming languages have highly structured data which can be transformed from one structure into another through a broker program. Assembler languages offer a rich way of defining individual data items. However, these data items are highly unstructured, as they can be placed anywhere within a program and can exist in any form.

SUMMARY

A computer-implemented method for transforming implicit data structures expressed by assembler code into high-level language structures includes analyzing a section of assembler code to identify a plurality of data items, wherein the section of assembler code has a beginning and an end. The computer-implemented method further includes storing the plurality of data items in a plurality of groups. The plurality of groups corresponds to the section of assembler code. The plurality of data items is stored based, at least in part, on: their offset from a start of a group in the section, and an order in which the data items are added to the section. The computer-implemented method further includes modifying one or more groups in the plurality of groups based, at least in part, on a pair of adjacent groups having a non-identical overlap. The computer-implemented method further includes creating an overlap list for each group, wherein the overlap list identifies those other groups in the plurality of groups that overlap with the group. The computer-implemented method further includes generating data modeling language for the section based, at least in part, on each overlap list. A corresponding computer system and computer program product are also disclosed.

DETAILED DESCRIPTION

Embodiments of the present invention recognize that due to the unstructured nature of assembler languages, pieces of data and parts of a program can be overwritten. Embodiments of the present invention recognize that due to the unstructured format of data items written in an assembler language, it becomes difficult for a broker program to cohesively identify the structure of an assembler program's data in order to transform the data.

Embodiments of the present invention discover implicit data structures as expressed by assembler code and transform the free-form assembler data into highly structured high-level language structures. Embodiments of the present invention generate data modeling language statements and constructs from assembler language while preserving implicit data structures that exist in assembler code.

Embodiments of the present invention map implicit data structures, found by analyzing assembler code, into a highly-structured form as expressed by a high-level language, such as data format description language ("DFDL"). DFDL is a modeling language for describing general text and binary data in a standard way. A DFDL model or schema allows any text or binary data to be read (or "parsed") from its native format and to be presented as an instance of an information set. An information set is a logical representation of the data contents, independent of the physical format. For example, two records can be represented by different formats (e.g., one record has fixed-length fields, while a second record uses delimiters), but can contain the same data and can be represented by the same information set. The DFDL schema also allows data to be taken from an instance of an information set and written out (or "serialized") into its native format.

It should generally be understood that DFDL is not a data format, nor does it impose the use of any particular data format. Instead it provides a standard way of describing many different kinds of data formats. DFDL achieves this by building upon the facilities of W3C XML Schema 1.0. In embodiments of the invention, a subset of XML Schema is used in order to enable the modeling of non-XML data. The motivations for this approach are to avoid inventing a completely new schema language, and to easily convert general text and binary data, via a DFDL information set, into a corresponding XML document.

Embodiments of the present invention provide for the use of a data model generator sub-system to create data modeling language statements representing the data items in each section of a program. Embodiments of the present invention provide for the use of a data model generator sub-system to discover the structure of assembler language data items based on the offsets of each data item within a program section. Each assembler language includes a number of sections and each section includes a number of data items and/or machine instructions. For example, IBM® High Level Assembler (HLASM) language provides two assembler directives (Define Constant (DC) and Define Storage (DS)) which an assembler application programmer uses to define storage areas that are referenced during program execution.

The present invention may be a method, computer program product, and/or a computer system for discovering the structure of data in an assembler language program and transforming it into a common data modeling language (such as DFDL or Extensible Markup Language (XML)). The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 1:
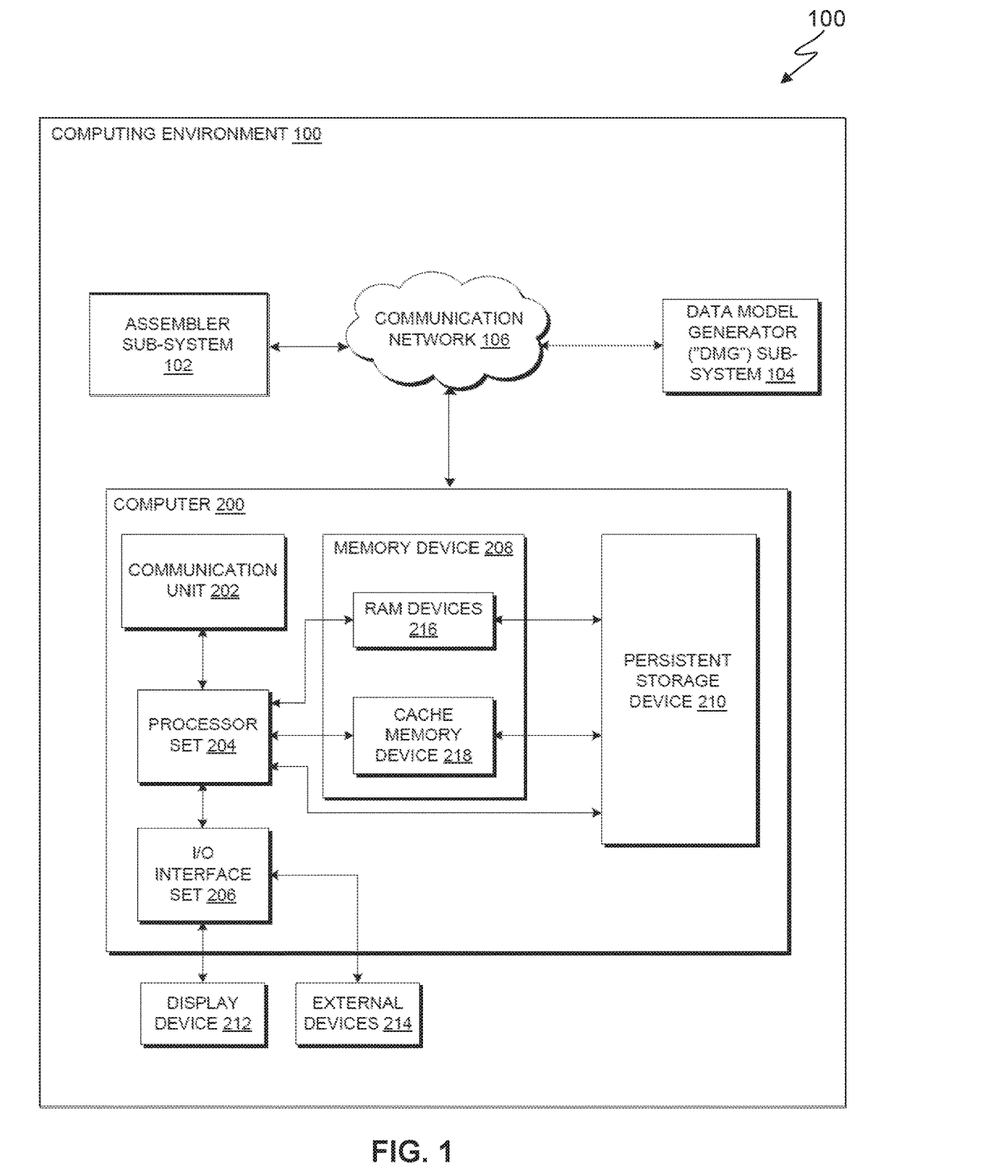
FIG. 1 is a functional block diagram of a computing environment in accordance with at least one embodiment of the invention.

An embodiment of a possible hardware and software environment for software and/or methods according to the present invention will now be described with reference to the Figures. FIG. 1 is a functional block diagram illustrating various portions of a computing environment, generally designated 100, suitable for operation of computer 200. FIG. 1 provides only an illustration of one implementation and does not imply any limitations with regard to the environments in which different embodiments may be implemented. Many modifications to the depicted environment may be made by those skilled in the art without departing from the scope of the invention as recited by the claims.

FIG. 1 includes: assembler sub-system 102; data model generator ("DMG") sub-system 104; communication network 106; computer 200; display device 212; and external devices 214. Computer 200 includes: communication unit 202; processor set 204; input/output (I/O) interface set 206; memory device 208; and persistent storage device 210. Memory device 208 contains: random access memory (RAM) devices 216; and cache memory device 218. Persistent storage device 210 includes program instructions for assembler sub-system 102 and DMG sub-system 104.

Assembler sub-system 102 is, in many respects, representative of the various computer sub-systems in the present invention. Accordingly, several portions of assembler sub-system 102 will now be discussed in the following paragraphs.

Assembler sub-system 102 may be a laptop computer, a tablet computer, a netbook computer, a personal computer (PC), a desktop computer, a personal digital assistant (PDA), a smart phone, or any programmable electronic device capable of communicating with client sub-systems via communication network 106.

Assembler sub-system 102 is capable of communicating with other computer subsystems via communication network 106. Communication network 106 can be, for example, a local area network (LAN), a wide area network (WAN) such as the Internet, or a combination of the two, and can include wired, wireless, or fiber optic connections. In general, communication network 106 can be any combination of connections and protocols that will support communications between assembler sub-system 102 and DMG sub-system 104.

Assembler sub-system 102 is shown as a block diagram with many double arrows. These double arrows (no separate reference numerals) represent a communications fabric, which provides communications between various components of assembler sub-system 102. This communications fabric can be implemented with any architecture designed for passing data and/or control information between processors (such as microprocessors, communications processors, and/or network processors, etc.), system memory, peripheral devices, and any other hardware components within a system. For example, the communications fabric can be implemented, at least in part, with one or more buses.

Memory device 208 and persistent storage device 210 are computer readable storage media. In general, memory device 208 can include any suitable volatile or non-volatile computer readable storage media. It is further noted that, now and/or in the near future: (i) external devices 214 may be able to supply some, or all, memory for assembler sub-system 102; and/or (ii) devices external to assembler sub-system 102 may be able to provide memory for assembler sub-system 102.

Program instructions for assembler sub-system 102 may be stored in persistent storage device 210, or more generally, any computer readable storage media, for access and/or execution by one or more processors of processor set 204, usually through memory device 208. Persistent storage device 210: (i) is at least more persistent than a signal in transit; (ii) stores the program (including its soft logic and/or data) on a tangible medium (such as magnetic or optical domains); and (iii) is substantially less persistent than permanent storage. Alternatively, data storage may be more persistent and/or permanent than the type of storage provided by persistent storage device 210.

Persistent storage device 210 may be a magnetic hard disk drive, a solid state disk drive, a semiconductor storage device, read-only memory (ROM), electronically erasable programmable read-only memory (EEPROM), flash memory, or any other computer readable storage media that is capable of storing program instructions or digital information.

The media used by persistent storage device 210 may also be removable. For example, a removable hard drive may be used for persistent storage device 210. Other examples include optical and magnetic disks, thumb drives, and smart cards that are inserted into a drive for transfer onto another computer readable storage medium that is also part of persistent storage device 210.

Communication unit 202, in these examples, provides for communications with other data processing systems or devices external to assembler sub-system 102. In these examples, communication unit 202 includes one or more network interface cards. Communication unit 202 may provide communications through the use of either or both physical and wireless communications links. Any software modules discussed herein may be downloaded to a persistent storage device (such as persistent storage device 210) through a communications unit (such as communication unit 202).

I/O interface set 206 allows for input and output of data with other devices that may be connected locally in data communication with computer 200. For example, I/O interface set 206 provides a connection to external devices 214. External devices 214 will typically include devices, such as a keyboard, a keypad, a touch screen, and/or some other suitable input device. External devices 214 can also include portable computer readable storage media, such as, for example, thumb drives, portable optical or magnetic disks, and memory cards. Software and data used to practice embodiments of the present invention can be stored on such portable computer readable storage media. In these embodiments, the relevant software may (or may not) be loaded, in whole or in part, onto persistent storage device 210 via I/O interface set 206. I/O interface set 206 also connects in data communication with display device 212.

Display device 212 provides a mechanism to display data to a user and may be, for example, a computer monitor or a smart phone display screen.

The programs described herein are identified based upon the application for which they are implemented in a specific embodiment of the invention. However, it should be appreciated that any particular program nomenclature herein is used merely for convenience, and thus, the invention should not be limited to use solely in any specific application identified and/or implied by such nomenclature.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Figure 2:
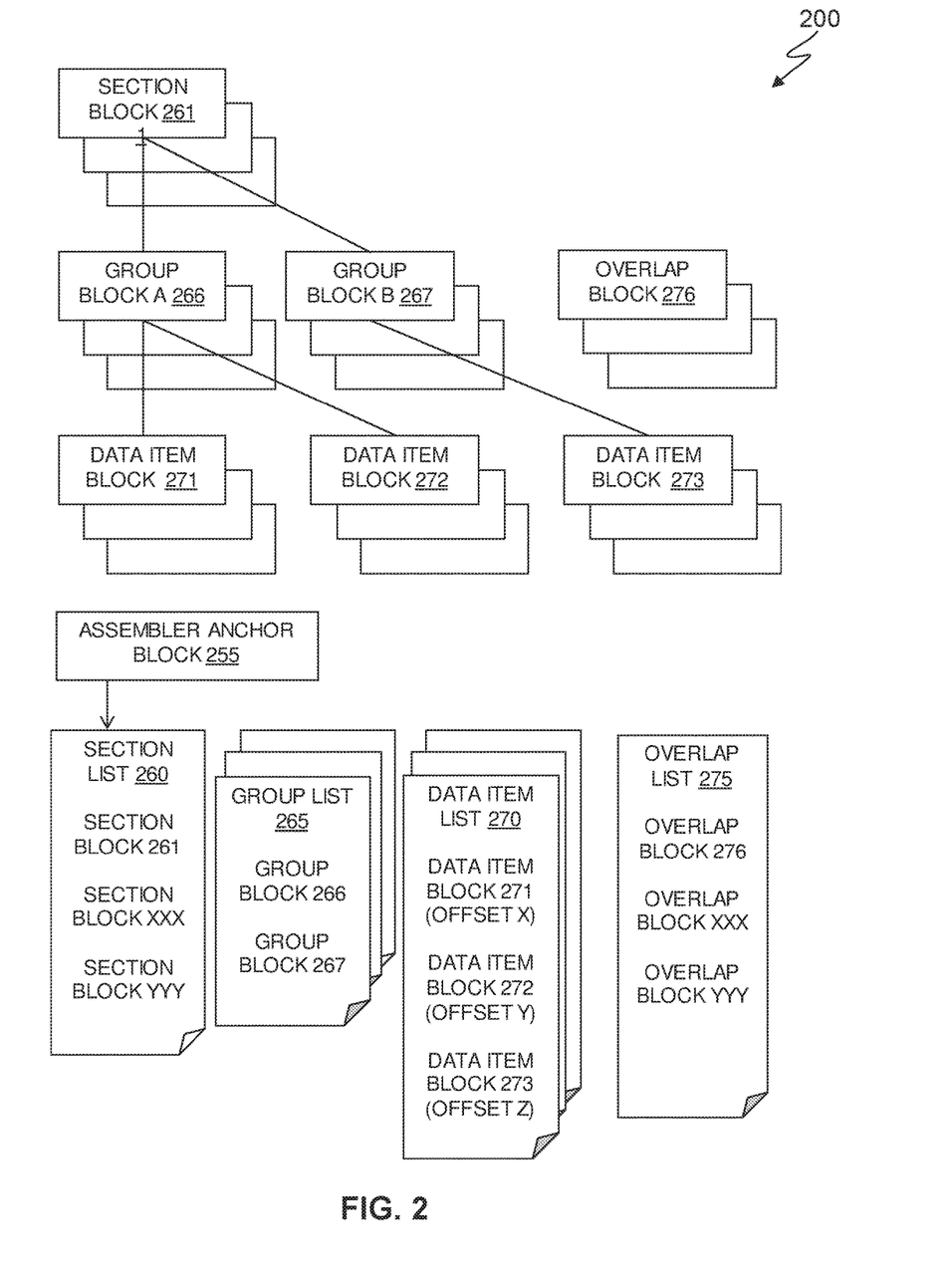
FIG. 2 is a schematic diagram illustrating additional data structures generated by an assembler sub-system in accordance with at least one embodiment of the invention.

FIG. 2 is a schematic diagram, generally designated 200, illustrating additional data structures generated by assembler sub-system 102 in accordance with at least one embodiment of the invention. In embodiments of the invention, in addition to its normal processing, assembler sub-system 102 creates three additional types of data structures for data model processing. The three additional types of data structures include section blocks, group blocks, and data item blocks. It should be appreciated that these additional data structures may be linked together so that a section block possesses a number of group blocks and each group block possesses a number of data item blocks.

For simplicity purposes, FIG. 2 depicts the following additional data structures: section block 261, group blocks 266 and 267, and data item blocks 271, 272, and 273. In the depicted embodiment, section block 261 includes group blocks 266 and 267. Group block 266 includes data item blocks 271 and 272. Group block 267 includes data item block 273. As further depicted in FIG. 2, section list 260, group list 265, and data item list 270 have been created. However, in embodiments of the invention, assembler sub-system 102 generates a plurality of section blocks. Accordingly, each section block can include multiple group blocks and each group block can include multiple data item blocks. Similarly, in embodiments of the invention, DMG sub-system 104 generates a plurality of group lists and data item lists, such that each group list includes multiple group blocks corresponding to a section block and each data item list includes multiple data items corresponding to multiple group blocks of a section block. It should be noted that throughout the specification, the terms section block, group block, and data item block may be used interchangeably with the terms section, group, and data item, respectively.

FIG. 2 further depicts assembler anchor block 255, which points to the start of section list 260, as well as the current section to which data is being added. The section block for the current section being processed is pointed to by part of assembler sub-system 102 so that as sections are paused and resumed, the correct section block representing a section of the assembler program that is currently being processed can be referenced. For example, in the depicted embodiment, assembler sub-system 102 has generated assembler anchor block 255 with a pointer initially directed to the start of the first section block (section block 261) in section list 260. Section list 260 points to corresponding group list 265, which includes group block 266 and group block 267. Group list 265 points to corresponding data item list 270, which includes data item block 271, data item block 272, and data item block 273. Additionally, group list 265 may point to a corresponding overlap list, such as overlap list 275. When outputting data item blocks corresponding to a group block, the output process begins with a data item pointed to at the start of a group and continues until a data item is reached that no longer points to the current group being processed.

As DMG sub-system 104 processes each section block, additional overlap blocks, such as overlap block 276, are created to keep track of how groups overlap with each other. In embodiments of the invention, each group block may have a pointer to one or more overlap blocks in an overlap list. If the pointer is 0, then no subsequent group block in a group list overlaps with the current group block being processed. If there is a pointer to an overlap list for a particular group block, then each entry in that overlap list represents a group block that overlaps with an original group block.

For example, if group block A is overlapped by group blocks B and C, then group block A will have an overlap list with pointers to group blocks B and C. In embodiments of the invention, overlaps are recorded in sequential order between groups blocks included in a group list. Thus, although an overlap between group block A and group block B could also be read as an overlap between group block B and group block A, only the overlap between group block A and group block B is recorded since the overlap is recorded in sequential order (i.e., the recording starts with group blocks at the beginning of a section block). Recording an overlap out of sequential order will result in an improper processing of the section block by DMG sub-system 104.

The following are examples of pointers for a section block, group block, data item block, and overlap block:

Section Block:

| | |
|---|---|
| NEXT_SECTION | Points to the next section block in the section list |
| 1st_DATA_ITEM | Points to the first data item within to the section block |
| 1st_GROUP | Points to the first group block within the section block |
| CURR_GROUP | Points to the current group block being processed |

Group Block:

| | |
|---|---|
| NEXT_GROUP | Points to the next group block in the group list |
| START_DATA | Points to the first data item within a group block |
| END_DATA | Points to the last data item within the group block |
| OVERLAP | Points to the start of an overlap list |

Data Item Block:

| | |
|---|---|
| NEXT_ITEM | Points to the next data item block in the data item list |
| SECTION_BLOCK | Points to the section block corresponding to the data item block |
| GROUP_BLOCK | Points to the group block corresponding to the data item block |

Overlap Block:

| | |
|---|---|
| NEXT_OVERLAP | Points to the next overlap block in the overlap list |
| OWNING_GROUP | Points to the group block which is being overlapped |
| OVERLAPPER | Points to the group block that causes the overlap |

In embodiments of the invention, a group block can have a pointer to the start and end data items in the group, but each data item can have a pointer to the group block to which it belongs. In other words, it may not be possible to directly determine all of the data items that belong to a particular group. This stems from the fact that if a group block pointed to all of the data items within the group, a new entry to a list would have to be created each time a new data item block is created in order for the group block to point to each new data item. This would result in the need for increased storage and processing time, as well as an increased complexity in managing all of the data structures.

For example, a current section block includes group block 1 (GB1) and group block 2 (GB2). GB1 includes data item blocks A, B, C, and D and GB2 includes data item block E. In this example, the data may be arranged as follows:

GB1_START_ITEM=A
    GB1_END_ITEM=D
    GB2_START_ITEM=E
    GB2_END_ITEM=E
    A_GROUP_BLOCK=GB1
    A_NEXT_ITEM=B
    B_GROUP_BLOCK=GB1
    B_NEXT_ITEM=C
    C_GROUP_BLOCK=GB1
    C_NEXT_ITEM=D
    D_GROUP_BLOCK=GB1
    D_NEXT_ITEM=E
    E_GROUP_BLOCK=GB2
    E_NEXT_ITEM=0 There is no subsequent data item in the list According to this arrangement, in order to find all of the data items that belong to the group G1, DMG sub-system 104 reads through the data items in sequential order to find those data items that have a group block of G1. However, the actual data item list and group lists remain the same.

In embodiments of the invention, DMG sub-system 104 performs the following operations for each group included in a section block:

(1) If a group overlaps the following group:
    (i) output an <xsd:choice> tag;
    (ii) start a new recursive instance of DMG sub-system 104 at the current point of its processing;
    (iii) output the contents of the group under scrutiny; and
    (iv) set the group as the current parent group
(2) If a group does not overlap with the following group:
    (i) output the contents of the group under scrutiny
(3) If DMG sub-system 104 is in a recursive state and the state needs to be terminated (e.g., the last group in the overlap list has been reached):
    (i) a return is made to the higher-level instances of DMG sub-system 104
(4) For each group whose contents are output, each item is output in the order that it was added to each group When outputting the contents of a group, processing begins with the data item pointed to by the start of the group block and continues outputting items in the list until it reaches an item that no longer points to the current group that is being processed.

Figure 3:
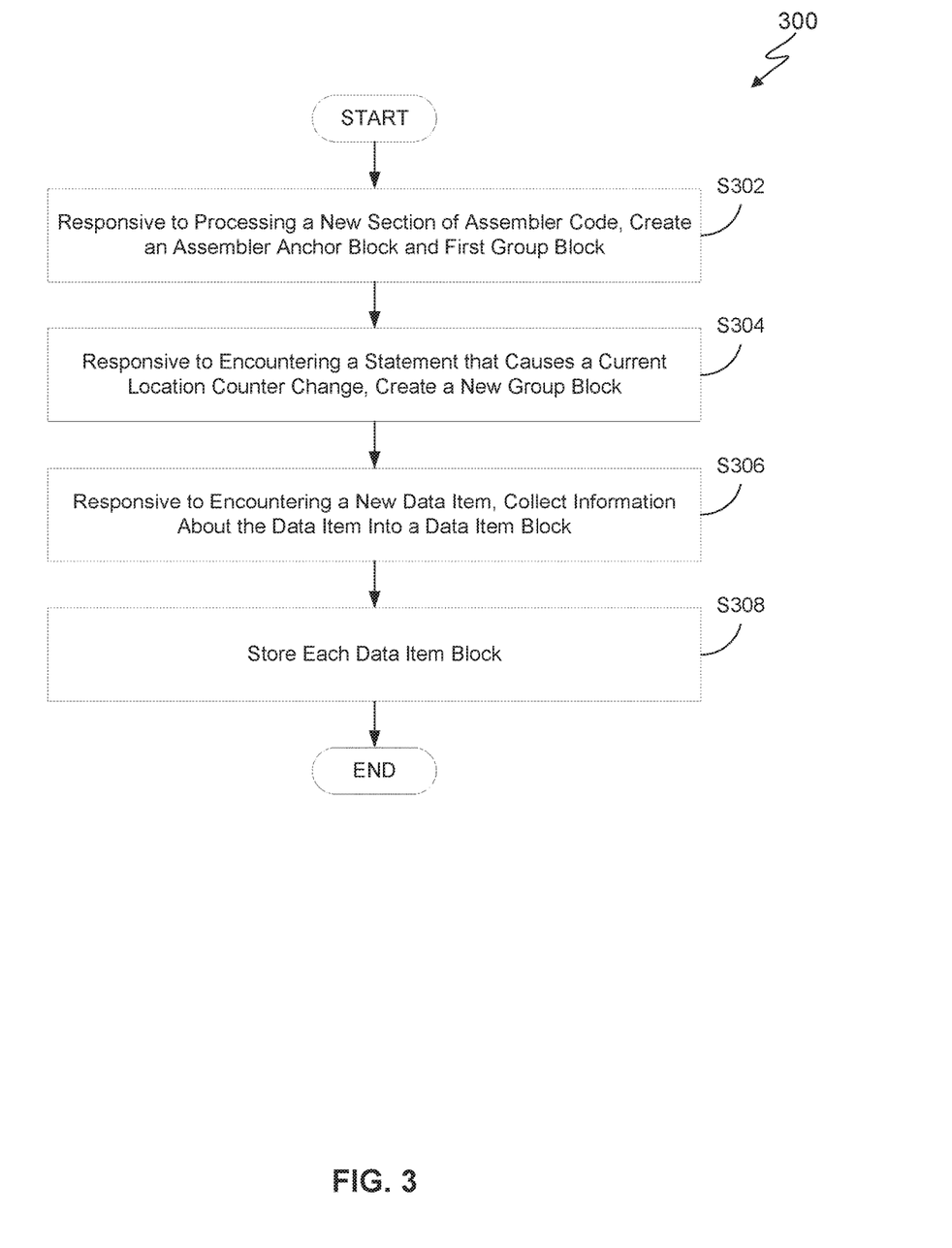
FIG. 3 is a flowchart diagram depicting operational steps for an assembler sub-system in accordance with at least one embodiment of the invention.

A series of operational steps will now be described below for a method of identifying data items and producing output data modelling language in accordance with at least one embodiment of the invention. Referring now to various embodiments of the invention in more detail, FIG. 3 is a flow chart diagram, generally designated 300, depicting operational steps for processing assembler code by assembler sub-system 102 in accordance with at least one embodiment of the invention. It should be appreciated that assembler sub-system 102 may perform steps S302, S304, S306, and S308 substantially simultaneously, in sequential order, or a portion of the steps substantially simultaneously. The assembler code includes a plurality of sections and each section includes a plurality of data items and/or machine instructions. The following steps are directed towards processing each of the plurality of sections.

At step S302, responsive to processing a new section of assembler code, assembler sub-system 102 creates an assembler anchor block and a first group block. An assembler anchor block represents a section of assembler code. Each assembler anchor block created is stored in a list. When assembler sub-system 102 creates an assembler anchor block corresponding to a section, it also creates a group block for the implicit value of the current location counter at the start of each section. The assembler anchor block corresponding to the current section being processed is pointed to by part of assembler sub-system 102 so that as sections are paused and resumed, the assembler anchor block representing a section that is currently being processed can be referenced.

At step S304, responsive to encountering a statement (e.g., an IBM® HLASM assembler language ORG (origin) instruction) that causes the current location counter to change, assembler sub-system 102 creates a new group block. The group blocks are used to map groups of data items processed by assembler sub-system 102. The current group block in use is pointed to by the current assembler anchor block in use so that the state of groups can be paused and resumed as sections are paused and resumed.

At step S306, responsive to encountering a data item, assembler sub-system 102 collects information about the data item into a data item block. A data item may be encountered via a language instruction of an assembler program. One example of an assembler language instruction is a DC or DS language instruction in the IBM® HLASM program. Information about the data item may include, but is not limited to the data item's name, data type, length, offset within the current section, and duplication factor. All of the information about a data item block is stored as a linked list. The linked list is sorted by offset from the start of the current section (to which all data items belong) and also by size if two or more items have the same offset within a program section. The current group block that is in use is pointed to by the data item block, which signifies that the data item belongs to that group. Similarly, the starting and ending data items, as well as the starting and ending offsets delimiting the group's state are also updated as new data items are added to a group.

At step S308, assembler sub-system 102 stores each data item block. In embodiments of the invention, each data item block is stored: (i) in the order of their offsets; and (ii) in the order in which they are added to a section during the processing of the assembler code. Similarly, when outputting data items from a group, the same order is used. It is important that each data item is stored in this manner since there is an exception to the uniqueness of the offsets of data items in a group if a group has a number of items of size 0. For example, data item D1 is at offset 32 and has a size of 0. Data item D2 follows data item D1 (i.e., D1 and D2 are in the same group) and has a size of 8. In this example, the location counter has not been manipulated and thus no new group has been created. Although D1 starts at offset 32, data D2 will also start at offset 32 because D1 has a size of 0. Accordingly, an overlap will occur between D1 and D2 at offset 32 for the same group.

Figure 4:
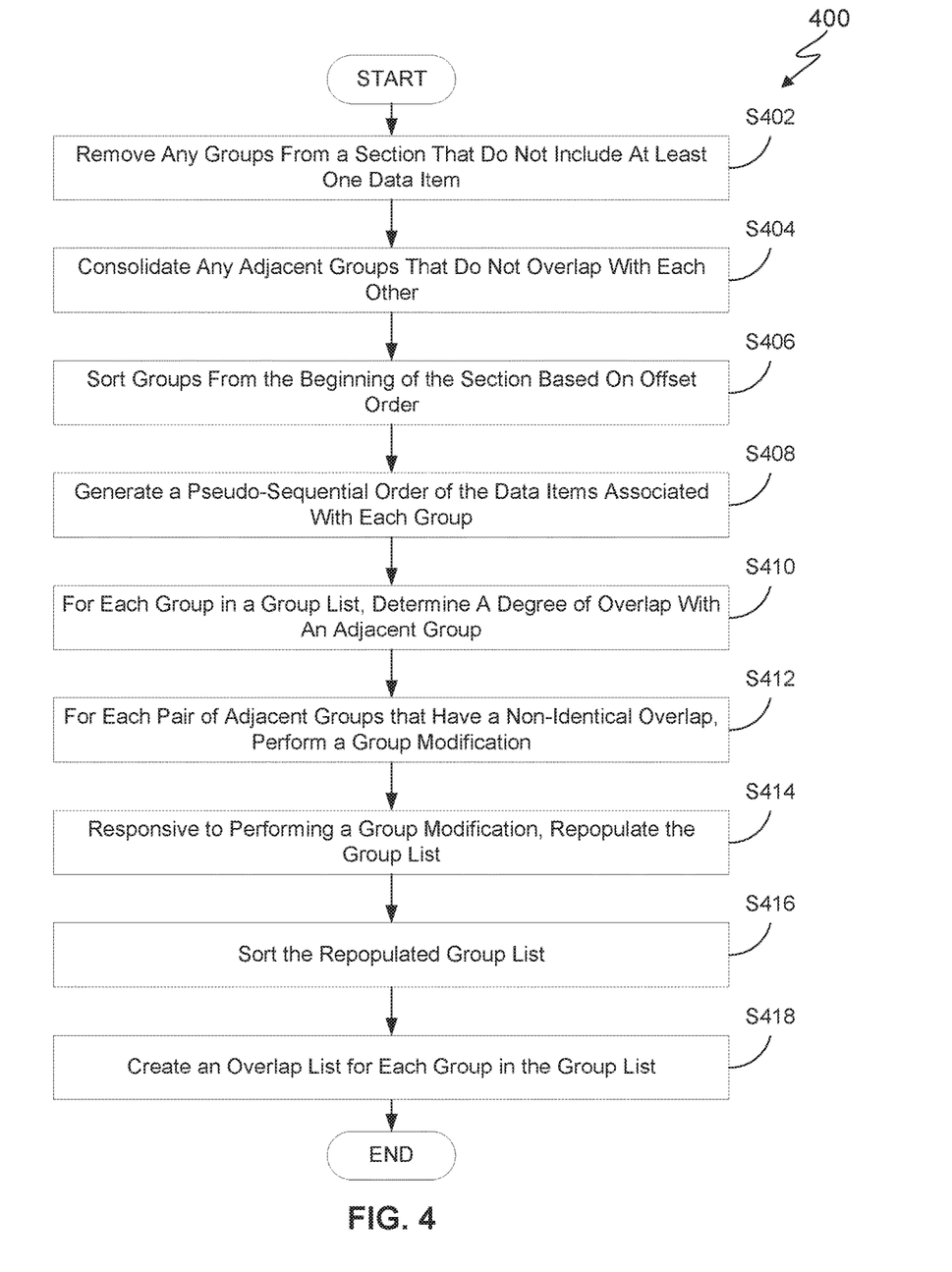
FIG. 4 is a flowchart diagram depicting operational steps for a data model generator sub-system in accordance with at least one embodiment of the invention.

FIG. 4 is a flow chart diagram, generally designated 400, depicting operational steps for DMG sub-system 104 in accordance with at least one embodiment of the invention. The following operational steps are directed towards refining groups of blocks corresponding to a section block. The refining process is repeated for each group of blocks corresponding to a section block. For any non-empty section blocks for the program, a standard data model header may be output by DMG sub-system 104.

At step S402, DMG sub-system 104 removes any groups from a section that do not include at least one data item.

At step S404, DMG sub-system 104 consolidates any adjacent groups that do not overlap with each other.

At step S406, DMG sub-system 104 sorts groups from the beginning of the section based on offset order. If two or more groups have the same offset, then the largest group is sorted earlier in the group list.

At step S408, DMG sub-system 104 generates a pseudo-sequential order of the data items associated with each group. The pseudo-sequential order is the order of data items as sorted by their offset from the start of the section for each group. If two or more items have the same offset in a group, then the largest item is stored earlier in the group list. The pseudo-sequential order is import since it is used to delimit the scope (i.e., domain/size) of each group.

At step S410, for each group in the group list, DMG sub-system 104 determines a degree of overlap with an adjacent group. For example, a group list includes Group A, Group B, Group C and Group D in sequential order. Here, Group A and Group B are analyzed for overlap, Group B and Group C are analyzed for overlap, and Group C and Group D are analyzed for overlap. The following is a list of possible ways in which a degree of overlap can be measured between two adjacent groups:
  (1) No Overlap—No overlap is present between two groups
  (2) Identical Overlap—Both groups are the same size and start at the same offset
  (3) Partial Overlap—The second group begins at an offset within the scope of the first group, but ends outside the scope of the first group
  (4) Engulfing Overlap:
    (i) At the Start—The second group begins at an offset which is equal to the start of the first group and ends at an offset within the scope of the first group
    (ii) Completely—The second group begins at an offset within the scope of the first group and ends within the scope of the first group
    (iii) At the End—The second group begins at an offset within the scope of the first group and ends at the same offset as the first group
  (5) Non-Identical Overlap—Includes both a partial overlap and an engulfing overlap At step S412, for each pair of adjacent groups that have a non-identical overlap, DMG sub-system 104 performs a group modification. In embodiments of the invention, a group modification may include splitting a group or padding a group. If splitting is performed, the data items in the first group in the pair are split into two new groups such that the first new group contains all the data items in the original first group until the "split point" and the second new group contains the data items of the first group after the "split point." The second new group is added to the end of the group list for the current section. If padding is performed, the second group in the pair is padded to match the size of the first group. The decision on whether a first group is split or a second group is padded is dependent on the number of data items and the offset position of the data items belonging to a pair of groups. The decision whether to split or pad will be further explained in FIGS. 6B-6D.

At step S414, responsive to performing a group modification, DMG sub-system 104 repopulates the group list. Repopulating the group list removes any groups which no longer have any data items. At step S416, responsive to repopulating the group list, DMG sub-system sorts the repopulated group list to take into account any new groups (and their associated data items) created from the splitting. For example, a group list includes group blocks A, B, and C. If splitting is performed between group blocks B and C, then group block B is split into two groups and a new group (group block D) is added after group block C. Steps S412-S416 may be repeated for each pair of adjacent groups in a section block that have a non-identical overlap. If a pair of adjacent groups have an identical overlap or no overlap, steps S412-S416 are skipped. This process continues for each sequential group in a section until the last group in a section is reached.

Once the refinement process is complete, at step S418, a subroutine is called to create an overlap list for each group. An overlap list may generally be understood as a list of groups that overlap another group. At this stage, any overlap between two groups should be identical. It should be appreciated that once an overlap list is created, DMG sub-system 104 is able to identify exactly which groups a particular group overlaps with, and more specifically, which data items overlap with a particular group. In some embodiments, DMG sub-system 104 bases a data modeling language for a section at least in part on a set of overlap lists. In further embodiments, DMG sub-system 104 bases a data modeling language for a section at least in part on a degree of overlap between a plurality of groups. In alternative embodiments, DMG sub-system 104 generates a data modeling language that defines a set of hierarchical data model elements in an assembler code.

Figure 5:
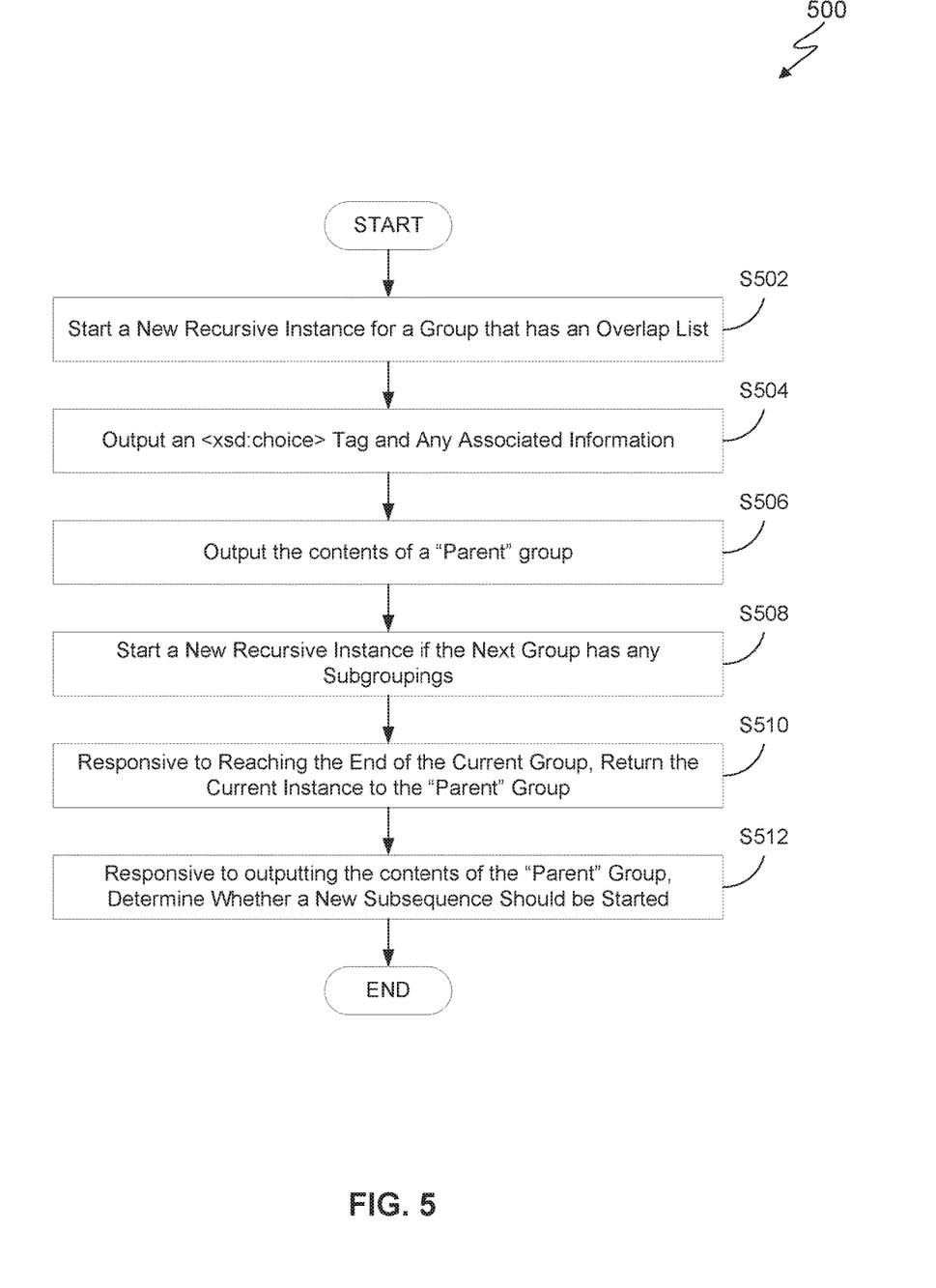
FIG. 5 is a flowchart diagram depicting operational steps for a data model generator sub-system in accordance with at least one embodiment of the invention.

FIG. 5 is a flowchart diagram, generally designated 500, depicting operational steps for DMG sub-system 104 in accordance with at least one embodiment of the invention. The following operational steps are directed towards processing and outputting the refined group list. At step S502, DMG sub-system 104 starts a new recursive instance for a group that has an overlap list. Starting a new recursive instance indicates that DMG sub-system 104 is currently processing an <xsd:choice> group. The group that causes the new recursive instance is set as the current "parent" for the new instance.

At step S504, responsive to starting the new recursive instance, DMG sub-system 104 outputs an <xsd:choice> tag and any associated information.

At step S506, DMG sub-system 104 outputs the contents of the "parent" group. The output of the contents of the "parent" group is initiated by outputting an <xsd:sequence> tag. An <xsd:sequence> tag is output here since all data items within the "parent" group are sequential. In embodiments of the invention, data items are output according to their "real order." The "real order" may generally be understood as the order in which the data items were added to the list of data items belonging to each successive group in a section.

At step S508, once the data item has been output which matches the current group's end item, the next group is checked to determine whether or not a new recursive instance needs to be started for any subgroupings. The DMG sub-system 104 may output </xsd:sequence> as necessary to denote the end of the sequence of data items output.

At step S510, once the end of the current group is reached, the current instance returns to its "parent." Since there are no more groups to process at this recursive level, DMG sub-system 104 returns to its "caller" (i.e., the previous recursive instance) and outputs </xsd:choice>.

At step S512, responsive to outputting the current "parent," DMG sub-system 104 determines whether a new subsequence should be started. A subsequence may generally be understood as a set of groups which are sequential despite DMG sub-system 104 currently being in a recursive state caused by a "choice" group. Determining whether a new subsequence should be started is dependent on how the next two groups overlap with each other. If the next two groups do not overlap with each other, then the current recursive instance is terminated and a new subsequence is started. Here, a new subsequence is started by staring a new recursive instance and marking the instance as "NOT" in a choice.

In embodiments of the invention, for each recursive instance that is terminated, it must pass back to its caller the last group in the list which it processed. This is done so that processing at the caller's level can continue at the next unprocessed group. In embodiments of the invention, whenever a recursive instance is terminated, DMG sub-system 104 outputs either an </xsd:choice> tag (if the instance was marked as "choice") or an </xsd:sequence> tag (if the instance was marked as "sequence").

FIGS. 6A-6D are schematic diagrams, generally designated 600, illustrating the following worked example of the group refinement process. The following data will be used through the worked example:

| | |
|---|---|
| MY_DATA_1 | DC F'1' |
| | ORG MY_DATA_1 |
| MY_DATA_2 | DC HL3'2' |
| MY_DATA_3 | DC X'3' |
| | ORG MY_DATA_2 |
| MY_DATA_4 | DC X'4' |
| MY_DATA_5 | DC X'5' |
| | ORG MY_DATA_4 |
| MY_DATA_6 | DC X'6' |
| MY_DATA_7 | DC X'7' |

Figure 6A:
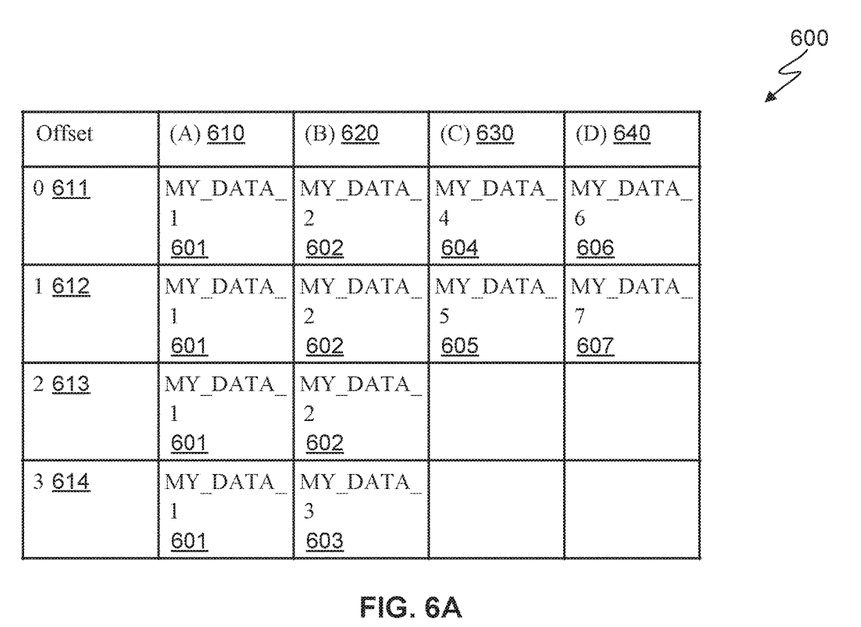
FIGS. 6A-6D are schematic diagrams illustrating a worked example in accordance with at least one embodiment of the invention.

At the start of the refinement process, assembler sub-system 102 creates a section block as depicted in FIG. 6A. The section block includes group blocks (A) 610, (B) 620, (C) 630, and (D) 640. Group block A includes data item MY_DATA_1 601. MY_DATA_1 starts at offset 0 and ends at offset 3. Group block B includes data items MY_DATA_2 602 and MY_DATA_3 603. MY_DATA_2 starts at offset 0 and ends at offset 2. MY_DATA_3 starts at offset 3 and ends at offset 4. Group block C includes data items MY_DATA_4 604 and MY_DATA_5 605. MY_DATA_4 starts at offset 0 and ends at offset 1. MY_DATA_5 starts at offset 1 and ends at offset 2. Group block D includes data items MY_DATA_6 606 and MY_DATA_7 607. MY_DATA_6 starts at offset 0 and ends at offset 1. MY_DATA_7 starts at offset 1 and ends at offset 2. As depicted in FIG. 6A, all of the group blocks overlap each other, but not all of the data items within the group blocks overlap with each other. For example, Group block (B) 620 and Group block (C) 630 overlap each other, but MY_DATA_5 605 does not overlap both MY_DATA_2 602 and MY_DATA_3 603. MY_DATA_5 605 only overlaps MY_DATA_2 602.

Continuing with FIG. 6A, the group refinement process beings by examining group block (A) 610 and group block (B) 620. It should be understood that the refinement process begins with the first group and moves sequentially through each adjacent group in the section block. As depicted in FIG. 6A, group block (A) 610 and group block (B) 620 overlap each other identically since their size and position of their overlap is identical (i.e., both group A and group B start at offset 0 and end at offset 3). Since they have an identical overlap, group A and group B can be output as a single choice and no adjustment to these two groups is made.

The refinement process continues with the group block (B) and group block (C) 630. As depicted in FIG. 6A, group block (B) 620 and group block (C) 630 do not have an identical overlap since there is no data item in group block (C) that overlaps with data item MY_DATA_3 603. Accordingly, a subroutine is called to determine if a data item in group block (B) 620 can be split. Since there are multiple data items in group block B 620, MY_DATA_3 603 is split from MY_DATA_2 602. Here, the splitting of group block (B) 620 will cause MY_DATA_3 603 to be removed from group block (B) 620 and placed into a newly created group block (E) 650 at the end of the section block.

Figure 6B:
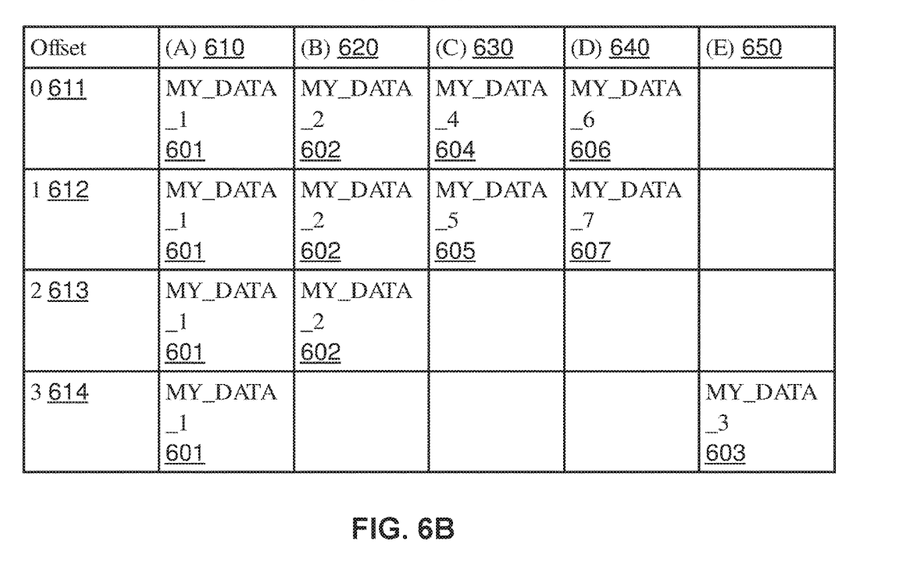

After the splitting of group bock (B) is complete, FIG. 6B depicts the section block after the groups have been re-populated and re-sorted. As depicted in FIG. 6B, MY_DATA_3 603 is now positioned in group block (E) 650 at offset 3. The refinement process continues with the next group to be processed. Since group block (B) 620 has changed from the splitting (the removal of MY_DATA_3 603), the refinement process starts again at group block (B) 620.

As depicted in FIG. 6B, group block (B) 620 and group block (C) 630 do not have an identical overlap, but instead have an engulfing overlap "at the start." Accordingly, a subroutine is called to determine if a data item in group block (B) 620 can be split. Since there is only a single data item (MY_DATA_2 602) in group block (B), a split cannot occur. Instead, group block (C) 630 is padded at 608 (FIG. 6C) so that its size matches that of group block (B) 620. After the padding of group block (C) 630, group block (B) 620 and group block (C) 630 have an identical overlap. Accordingly, no further processing on group block (B) 620 is required.

Figure 6C:
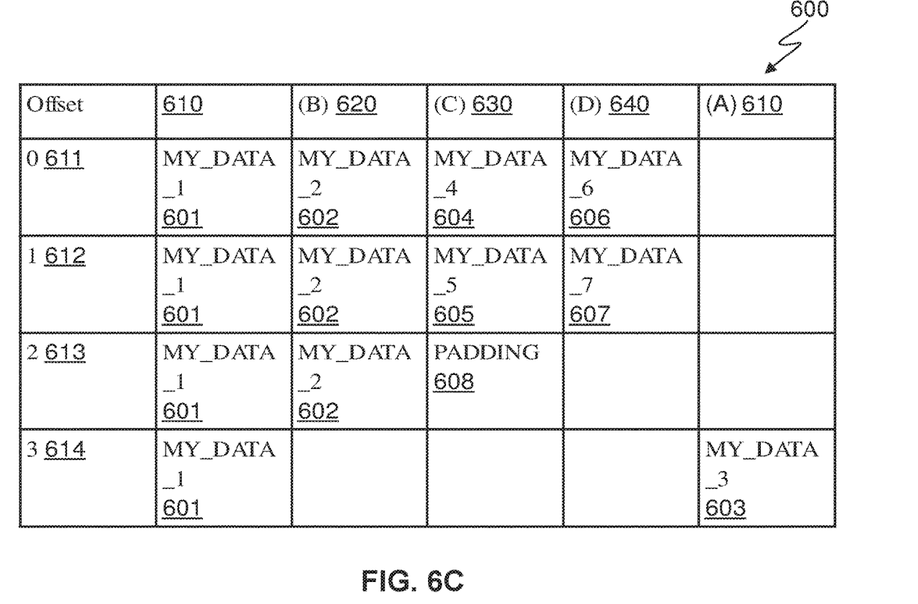

FIG. 6C depicts the section block after the padding of group block (C) 630. The refinement process continues with the next group to be processed. Since group block (C) 630 changed from the added padding, the refinement process starts again at group block (C) 630. As depicted in FIG. 6C, group block (C) 630 and group block (D) 640 do not have an identical overlap, but instead have an engulfing overlap "at the start." Accordingly, a subroutine is called to determine if a data item in group block (C) 630 can be split. Since padding was added to group block (C) 630, any data items in the group cannot be split. Instead, group block (D) 640 is padded at 609 (FIG. 6D) so that its size matches that of group block (C) 630. After padding group block (D) 640, group block (C) 630 and group block (D) 640 have an identical overlap. Accordingly, no further processing on group C is required.

Figure 6D:
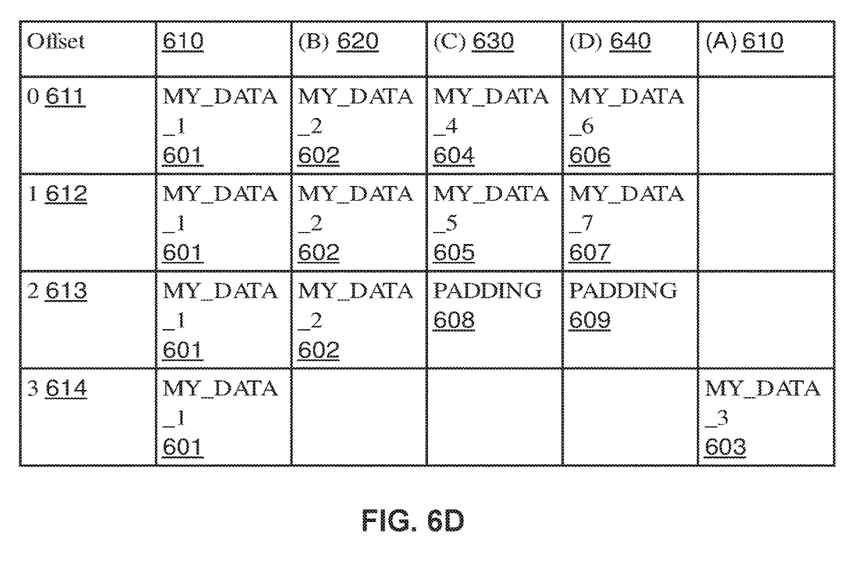

FIG. 6D depicts the section block after the padding of group block (D) 640. The refinement process continues with the next group to be processed. Since group block (D) 640 changed from the added padding, the refinement process starts again at group block (D) 640. As depicted in FIG. 6D, group block (D) 640 and group block (E) 650 have no overlap. Since there is no overlap between the groups, no adjustment is made to group block (D) 640. The refinement process continues with the next group to be processed (group block (E) 650). Since group block (E) 650 is at the end of the section block, the refinement process is complete.

Continuing with the current worked example, once the refinement process is complete, DMG sub-system 104 creates the following overlap list:

(A) overlaps with (B), (C), (D), and (E)
(B) overlaps with (C) and (D)
(C) overlaps with (D)
(D) has no overlaps
(E) has no overlaps After creating the above overlap list, DMG sub-system 104 begins outputting the groups. Since group block (A) 610 has a choice, a new recursive instance (RECUR_1) is started, an <xsd:choice> is output, group block (A) 610 is output, and designated as the group parent. The DFDL output is as follows:

```
<xsd:choice ...>
    <xsd:element name="MY_DATA_1"... />
```

At the end of processing group block (A) 610, the next group (group block (B) 620) is checked to determine whether or not a new subsequence should be started. Since group block (A) 610 does not overlap identically with group block (B) 620, it is not possible to start a new subsequence.

Group block (B) 620 is now examined. Since group block (B) 620 has an overlap, a new recursive (RECUR_2) instance is started, an <xsd:choice> is output, group block (B) 620 is output, and designated as the group parent. The DFDL output is as follows:

```
<xsd:choice ...>
    <xsd:element name="MY_DATA_1" ... />
    <xsd:choice>
        <xsd:sequence>
            <xsd:element name="MY_DATA_2" ... />
```

At the end of processing group block (B) 620, the next group (group block (C) 630) is checked to determine whether or not a new subsequence should be started. Since group blocks (B) 620 and (C) 630 have an identical overlap and group blocks (B) 620 and (D) 640 have an identical overlap, they are determined to be peers and therefore a new subsequence is initiated. Here, a new recursive instance (RECUR_3) is started that is in a "sequence" rather than a "choice." Group block (B) 620 is then set as the parent for the new recursive instance and all groups are output in sequence until the end of group block B's overlap list (i.e., group block (C) 630 and group block (D) 640 are output). The DFDL output here is as follows:

```
<xsd:choice ...>
    <xsd:element name="MY_DATA_1" ... />
    <xsd:choice>
        <xsd:sequence>
            <xsd:element name="MY_DATA_2" ... />
        </xsd:sequence>
        <xsd:sequence>
            <xsd:element name="MY_DATA_4" ... />
            <xsd:element name="MY_DATA_5" ... />
        </xsd:sequence>
        <xsd:sequence>
            <xsd:element name="MY_DATA_6" ... />
            <xsd:element name="MY_DATA_7" ... />
        </xsd:sequence>
```

Once the end of the overlap list of the current parent, group block (B) 620 is reached, the current recursive state (RECUR_3) terminates and relays that the last group to have been processed was group (D). The parent in recursive state RECUR_2 is group block (B) 620. Since it is at the end of group (B)'s overlap list and has already been output, the recursive state RECUR_2 is terminated, an </xsd:choice> tag is output (since RECUR_2 is in a choice state) and group (D) is passed back to the caller. At this stage, the DFDL output looks as follows:

```
<xsd:choice ...>
    <xsd:element name="MY_DATA_1" ... />
    <xsd:choice>
        <xsd:sequence>
            <xsd:element name="MY_DATA_2" ... />
        </xsd:sequence>
        <xsd:sequence>
            <xsd:element name="MY_DATA_4" ... />
            <xsd:element name="MY_DATA_5" ... />
        </xsd:sequence>
        <xsd:sequence>
            <xsd:element name="MY_DATA_6" ... />
            <xsd:element name="MY_DATA_7" ... />
        </xsd:sequence>
    </xsd:choice>
```

At this point, the current recursive state of DMG sub-system 104 is RECUR_1 and the parent is group block (A) 610. Since the last group that was processed was group block (D) 640, the next group to be processed is group block (E) 650. Since group block (E) 650 has no overlaps, the group block (E) 650 is output. The DFDL output looks as follows:

```
<xsd:choice ...>
    <xsd:element name="MY_DATA_1" ... />
    <xsd:choice>
        <xsd:sequence>
            <xsd:element name="MY_DATA_2" ... />
        </xsd:sequence>
        <xsd:sequence>
            <xsd:element name="MY_DATA_4" ... />
            <xsd:element name="MY_DATA_5" ... />
        </xsd:sequence>
        <xsd:sequence>
            <xsd:element name="MY_DATA_6" ... />
            <xsd:element name="MY_DATA_7" ... />
        </xsd:sequence>
    </xsd:choice>
    <xsd:element name="MY_DATA_3" ... />
```

Since the end of the list has been reached, the recursive state RECUR_1 is terminated and group (E) is passed back to the original caller. As RECUR_1 terminates, an </xsd:choice> tag is output (since RECUR_1 is in a choice state). At the end of this processing, the DFDL looks as follows:

```
<xsd:choice ...>
    <xsd:element name="MY_DATA_1" ... />
    <xsd:choice>
        <xsd:sequence>
            <xsd:element name="MY_DATA_2" ... />
        </xsd:sequence>
        <xsd:sequence>
            <xsd:element name="MY_DATA_4" ... />
            <xsd:element name="MY_DATA_5" ... />
        </xsd:sequence>
        <xsd:sequence>
            <xsd:element name="MY_DATA_6" ... />
            <xsd:element name="MY_DATA_7" ... />
        </xsd:sequence>
    </xsd:choice>
    <xsd:element name="MY_DATA_3" ... />
</xsd:choice>
```

Once the end of all groups for the current section has been reached, the DMG sub-system 104 exits its recursive states until it reaches the original non-recursive level of itself. From this point, it can start processing the next section block in the list of sections for the current program. Once all section blocks have been output, a DFDL footer section is output. It should be appreciated that the previous worked example demonstrates a method for DFDL generation within an assembler language that allows for the discovery of high-level language data structures.

What is claimed is:

1. A computer-implemented method for transforming implicit data structures expressed by assembler code into high-level language structures, the method comprising:
    analyzing a section of assembler code to identify a plurality of data items, wherein the section of assembler code has a beginning and an end;
    storing the plurality of data items in a plurality of groups, wherein:
        the plurality of groups corresponds to the section of assembler code; and
        the plurality of data items is stored based, at least in part, on:
            their offset from a start of a group in the section; and
            an order in which the data items are added to the section;
    modifying one or more groups in the plurality of groups based, at least in part, on a pair of adjacent groups having a non-identical overlap, wherein modifying the one or more groups in the plurality of groups further includes performing at least one of splitting or padding the pair of adjacent groups based, at least in part, on: (i) a number of data items included in the pair of adjacent groups, and (ii) an offset position of each data item in the pair of adjacent groups;
    creating an overlap list for each group, wherein the overlap list identifies those other groups in the plurality of groups that overlap with the group; and
    generating data modeling language for the section based, at least in part, on each overlap list.

2. The computer-implemented method of claim 1, wherein performing at least one of splitting or padding the pair of adjacent groups includes:
    splitting two data items stored in a first group of the pair of adjacent groups into two groups, such that:
        a first sub-group contains data items of the first group up to a split point, and
        a second sub-group contains data items of the first group after the split point.

3. The computer-implemented method of claim 1, wherein performing at least one of splitting or padding the pair of adjacent groups includes:
    padding a second group in the pair of adjacent groups to match a size of a first group in the pair of adjacent groups.

4. The computer-implemented method of claim 1, wherein two groups are determined to overlap if a data item in each of the two groups shares a common offset position in the section.

5. The computer-implemented method of claim 1, wherein generating the data modeling language for the section is further based, at least in part, on determining a degree of overlap between two groups.

6. The computer-implemented method of claim 1, wherein the data modeling language defines hierarchical data model elements in the assembler code.

* * * * *